United States Patent
Yin et al.

(10) Patent No.: US 12,424,452 B2
(45) Date of Patent: Sep. 23, 2025

(54) DEFLECTABLE PLATENS AND ASSOCIATED METHODS

(71) Applicant: APPLIED Materials, Inc., Santa Clara, CA (US)

(72) Inventors: Ming Yin, Gloucester, MA (US); Dawei Sun, Nashua, NH (US)

(73) Assignee: APPLIED Materials, Inc.

( * ) Notice: Subject to any disclaimer, the term of this patent is extended or adjusted under 35 U.S.C. 154(b) by 677 days.

(21) Appl. No.: 17/683,479

(22) Filed: Mar. 1, 2022

(65) Prior Publication Data
US 2022/0189784 A1    Jun. 16, 2022

Related U.S. Application Data

(62) Division of application No. 16/657,020, filed on Oct. 18, 2019, now Pat. No. 11,302,536.

(51) Int. Cl.
*H01L 21/324* (2006.01)
*H01L 21/20* (2006.01)
*H01L 21/683* (2006.01)

(52) U.S. Cl.
CPC ........ *H01L 21/324* (2013.01); *H01L 21/2007* (2013.01); *H01L 21/6835* (2013.01)

(58) Field of Classification Search
CPC ........... H01L 21/6833; H01L 21/68735; H01L 21/324
See application file for complete search history.

(56) References Cited

U.S. PATENT DOCUMENTS

| | | | | |
|---|---|---|---|---|
| 6,272,002 | B1* | 8/2001 | Mogi | H02N 13/00 |
| | | | | 279/128 |
| 6,535,371 | B1 | 3/2003 | Kayamoto et al. | |
| 7,468,880 | B2* | 12/2008 | Itakura | H01L 21/6831 |
| | | | | 361/234 |
| 2003/0161088 | A1* | 8/2003 | Migita | H01L 21/6831 |
| | | | | 361/234 |
| 2013/0148253 | A1 | 6/2013 | Komatsu et al. | |
| 2015/0214087 | A1 | 7/2015 | Stone et al. | |
| 2017/0372934 | A1 | 12/2017 | Shiraiwa et al. | |
| 2018/0047604 | A1* | 2/2018 | Takemoto | H01L 21/6831 |
| 2018/0053678 | A1 | 2/2018 | Kugimoto | |

(Continued)

FOREIGN PATENT DOCUMENTS

| CN | 104364882 A | 2/2015 |
|---|---|---|
| CN | 107646136 A | 1/2018 |

(Continued)

OTHER PUBLICATIONS

International Search Report dated Dec. 22, 2020, for the International Patent Application No. PCT/US2020/050087, filed on Sep. 10, 2020, 3 pages.

(Continued)

*Primary Examiner* — Ali Naraghi
(74) *Attorney, Agent, or Firm* — KDW Firm PLLC

(57) ABSTRACT

A deflectable platen including a first layer formed of a material having a first coefficient of thermal expansion (CTE), and a second layer bonded to the first layer and having a second CTE, the second layer including a plurality of electrodes embedded therein for facilitating electrostatic clamping of wafers to the second layer, wherein the second CTE is different than the first CTE.

8 Claims, 4 Drawing Sheets

(56) References Cited

U.S. PATENT DOCUMENTS

2018/0108556 A1* 4/2018 Takebayashi ......... C04B 37/006
2019/0013231 A1* 1/2019 Yamaguchi ....... H01L 21/67103

FOREIGN PATENT DOCUMENTS

| | | | |
|---|---|---|---|
| CN | 107958837 | A | 4/2018 |
| JP | 11168134 | A | 6/1999 |
| JP | 2002176096 | A | 6/2002 |
| JP | 2004335742 | A | 11/2004 |
| JP | 2007067349 | A | 3/2007 |
| JP | 2008300491 | A | 12/2008 |
| JP | 2010103321 | A | 5/2010 |
| JP | 2010186765 | A | 8/2010 |
| JP | 2011060826 | A | 3/2011 |
| JP | 2016171185 | A | 9/2016 |
| KR | 1020110038012 | A | 4/2011 |
| KR | 1020130071441 | A | 6/2013 |
| WO | 2009148819 | A3 | 4/2010 |
| WO | 2011149541 | A1 | 12/2011 |
| WO | 2019118320 | A | 6/2019 |
| WO | 2019178030 | A | 9/2019 |

OTHER PUBLICATIONS

Written Opinion dated Dec. 22, 2020, for the International Patent Application No. PCT/US2020/050087, filed on Sep. 10, 2020, 5 pages.

* cited by examiner

DEFLECTABLE PLATENS AND ASSOCIATED METHODS

CROSS-REFERENCE TO RELATED APPLICATION

This application claims priority to and is a divisional application of U.S. Non-Provisional patent application Ser. No. 16/657,020, filed on Oct. 18, 2019, entitled "DEFLECTABLE PLATENS AND ASSOCIATED METHODS," which is incorporated herein by reference in its entirety.

FIELD OF THE DISCLOSURE

Embodiments of the present disclosure relate generally to the field of semiconductor device fabrication, and more particularly to deflectable platens for facilitating effective electrostatic clamping of semiconductor wafers.

BACKGROUND OF THE DISCLOSURE

Semiconductor wafers are typically disposed on flat platens during ion implantation and certain other processes performed during semiconductor device fabrication. Commonly, a semiconductor wafer is secured to a platen via electrostatic clamping, wherein an electrical voltage is applied between embedded electrodes in a platen and a resulting electric field holds a semiconductor wafer to the platen. Electrostatic clamping is preferable to mechanical clamping since mechanical clamping can damage and/or contaminate a semiconductor wafer.

The ability of a platen to securely clamp a semiconductor wafer thereto via electrostatic clamping largely depends on the proximity of the bottom surface of the semiconductor wafer to the top surface of the platen. Ideally, both of these surfaces are planar and are disposed in flat, continuous contact with one another. In some cases, a semiconductor wafer may be warped (e.g., deflected up to 20 thousandths of an inch (thou)), resulting in a relatively large gap between a bottom surface of the semiconductor wafer and a top surface of a platen. This may result in weak or ineffective electrostatic clamping. This problem can be exacerbated if the semiconductor wafer and the platen are exposed to high temperature processes (e.g., during high temperature ion implantation), wherein incoherent deflection of the semiconductor wafer and the platen may cause the gap therebetween to increase in size.

Thus, minimizing surface-to-surface proximity between a semiconductor wafer and a platen is desirable for facilitating secure electrostatic clamping therebetween. With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

A deflectable platen in accordance with a non-limiting embodiment of the present disclosure may include a first layer formed of a material having a first coefficient of thermal expansion (CTE), and a second layer bonded to the first layer and having a second CTE, the second layer including a plurality of electrodes embedded therein for facilitating electrostatic clamping of wafers to the second layer, wherein the second CTE is different than the first CTE.

A deflectable platen in accordance with another non-limiting embodiment of the present disclosure may include a first layer formed of a material having a first CTE, a second layer bonded to the first layer and having a second CTE greater than the first CTE, the second layer including a plurality of electrodes embedded therein for facilitating electrostatic clamping of wafers to the second layer, and a heat trace disposed between the first layer and the second layer and adapted to controllably heat the first layer and the second layer.

A method of deflecting a platen in accordance with a non-limiting embodiment of the present disclosure may include providing a first layer formed of a material having a first CTE, and providing a second layer bonded to the first layer and having a second CTE, the second layer including a plurality of electrodes embedded therein for facilitating electrostatic clamping of wafers to the second layer, wherein the second CTE is different than the first CTE, and one of heating the first and second layers to a temperature in a range of 300 degrees Celsius to 600 degrees Celsius and cooling the first and second layers to a temperature in a range of −50 degrees Celsius to −150 degrees Celsius.

BRIEF DESCRIPTION OF THE DRAWINGS

By way of example, various embodiments of the disclosed apparatus will now be described, with reference to the accompanying drawings, wherein.

DETAILED DESCRIPTION

Figure 1A:
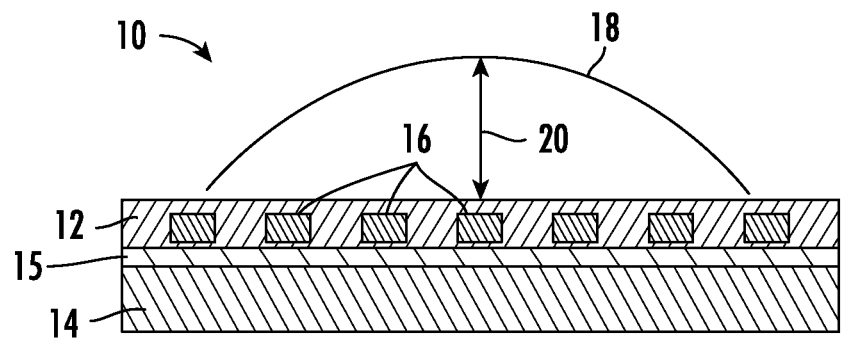
FIG. 1A is a cross sectional side view illustrating an exemplary embodiment of a deflectable platen in accordance with the present disclosure with a semiconductor wafer disposed thereon.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Referring to FIG. 1A, a cross-sectional side view illustrating a deflectable platen 10 (hereinafter "the platen 10") in accordance with an exemplary embodiment of the present disclosure is shown. The platen 10 may be elastically deformable (as further described below) for providing a close clearance relationship between a top surface of the platen 10 and a bottom surface of a warped or bowed semiconductor wafer disposed upon the platen 10 to facilitate effective electrostatic clamping therebetween.

The platen 10 may include a generally planar first layer 12 formed of a first material and a generally planar second layer 14 formed of a second material disposed atop the first layer 12. The first material may have a first coefficient of thermal expansion (CTE) and the second material may have a second CTE, wherein the second CTE may be greater than the first CTE. The first and second layers 12, 14 may be flatly bonded together, such as by brazing or other techniques suited to bonding the first and second materials together. In various embodiments, the platen 10 may include a heat trace 15 disposed or "sandwiched" between the first and second layers 12, 14. The heat trace 15 may include an electrical heating element (e.g., one or more wires, cables, plates, tapes, etc.) connected to an electrical power source (not shown). The heat trace 15 may be flexible and may be adapted to withstand deflection of the platen 10 up to at least 20 thou (as described below), for example. By activating the heat trace 15, the abutting first and second layers 12, 14 of the platen 10 may be controllably heated as further described below.

In one example, the first layer 12 of the platen 10 may be formed of a material having a CTE less than $6.0 \times 10^{-7}/°$ C. (e.g., between $2.0 \times 10^{-7}/°$ C. and $4.0 \times 10^{-7}/°$ C.). In a specific example, first layer 12 may be formed of quartz. The present disclosure is not limited in this regard. The first layer 12 may alternatively be formed of other relatively low-CTE materials, including, and not limited to, carbon, silicon, silicon nitride, silicon carbide, aluminum nitride, INVAR, KOVAR, molybdenum, tungsten, tantalum, titanium, and their alloys. In one example, the second layer 14 of the platen 10 may be formed of a material having a relatively higher CTE than the first layer 12 (e.g., a material having a CTE in a range between $6.0 \times 10^{-7}/°$ C. and $8.0 \times 10^{-7}/°$ C.). In a specific example, second layer 14 may be formed of a ceramic, including, and not limited to, aluminum oxide. The present disclosure is not limited in this regard. The second layer 14 may alternatively be formed of other relatively higher-CTE materials including, and not limited to, aluminum, silver, copper, and their alloys.

The second layer 14 of the platen 10 may have a plurality of electrodes 16 embedded therein. The electrodes 16 may be connected to a source of electrical power (not shown) and may be arranged and configured to operate in the manner of a conventional electrostatic clamp familiar to those of skill in the art. Particularly, by applying an electrical voltage across the electrodes 16, an electrical field can be generated and may hold a semiconductor wafer 18 (hereinafter "the wafer 18") to the platen 10 via electrostatic force. The strength of the electrostatic force acting on the wafer 18 will depend partly on the proximity of the wafer 18 to the electrodes 16. Ideally, the contour of the bottom surface of the wafer 18 will match or nearly match the contour of the top surface of the platen 10 (e.g., if both surfaces are planar or nearly planar), thus establishing a shortest possible distance between the electrodes 16 and the wafer 18 to provide strong electrostatic coupling therebetween. In some cases, a wafer, such as the wafer 18 shown in FIG. 1A, may be warped or bowed (e.g., deflected up to, and possibly greater than, 20 thou) and may present a concave bottom surface to the generally planar top surface of the platen 10 (the deflection of the wafer 18 as shown in FIG. 1A is exaggerated for purposes of illustration). The resulting gap 20 between the wafer 18 and the platen 10 may attenuate the electrostatic force acting on the wafer 18, thus resulting in poor electrostatic clamping between the platen 10 and the wafer 18.

Figure 1B:
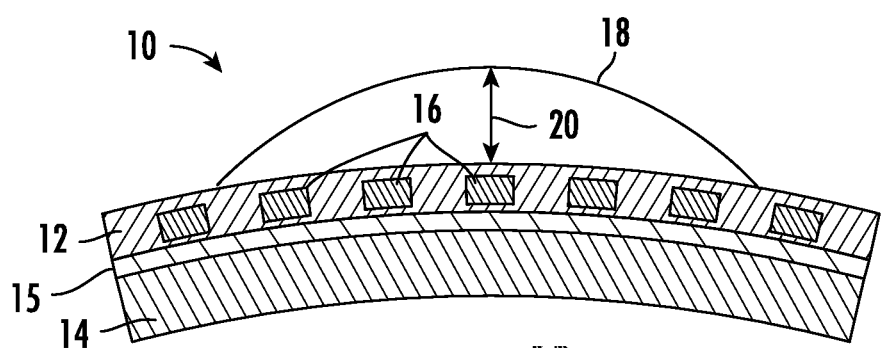
FIG. 1B is a cross sectional side view illustrating the deflectable platen of FIG. 1A in a deflected state with the semiconductor wafer disposed thereon.

Referring to FIG. 1B, the platen 10 is shown in a deflected state. Particularly, the heat trace 15 has been activated, thus heating the first and second layers 12, 14 of the platen 10. Since the CTE of the second layer 14 is greater than the CTE of the first layer 12, the heated second layer 14 may expand more (i.e., more quickly and/or to a greater degree) than the heated first layer 12, resulting in a convex deflection of the platen 10. Thus, the contour of the top surface of the platen 10 may be made to more closely match the contour of the bottom surface of the wafer 18 to reduce the size of the gap 20 therebetween relative to the undeflected state of the platen 10 shown in FIG. 1A. In various examples, the platen 10 may be heated to a temperature between 300 degrees Celsius and 600 degrees Celsius. In a particular non-limiting example, the platen 10 may exhibit a deflection of 18 thou when heated to a temperature of 500 degrees Celsius. The present disclosure is not limited in this regard. The smaller gap 20 and closer proximity of the electrodes 16 to the wafer 18 facilitated by the deflected platen 10 provide a stronger electrostatic force acting on the wafer 18 relative to the electrostatic force applied by the undeflected platen 10 shown in FIG. 1A, thus resulting in better electrostatic coupling between the platen 10 and the wafer 18.

The degree of deflection in the heated platen 10 will depend on a number of factors, including, and not limited to, the CTEs of the first and second layers 12, 14, the amount of heat applied to the first and second layers 12, 14, the diameters of the first and second layers 12, 14, and the thicknesses of the first and second layers 12, 14. In a non-limiting embodiment, the thickness of the first layer 12 may be 4 millimeters and the thickness of the second layer 14 may be 4 millimeters. In another non-limiting embodiment, the thickness of the first layer 12 may be 6 millimeters and the thickness of the second layer 14 may be 4 millimeters. In another non-limiting embodiment, the thickness of the first layer 12 may be 8 millimeters and the thickness of the second layer 14 may be 4 millimeters. The present disclosure is not limited in this regard, and the thicknesses of the first and second layers 12, 14 may be varied from those mentioned above. Additionally, while the platen 10 has been described as including the integrated heat trace 15 for controllably heating the platen 10, embodiments of the platen 10 are contemplated wherein the heat trace 15 is omitted and the platen 10 is heated by an external heat source (e.g., an oven).

Figure 1C:
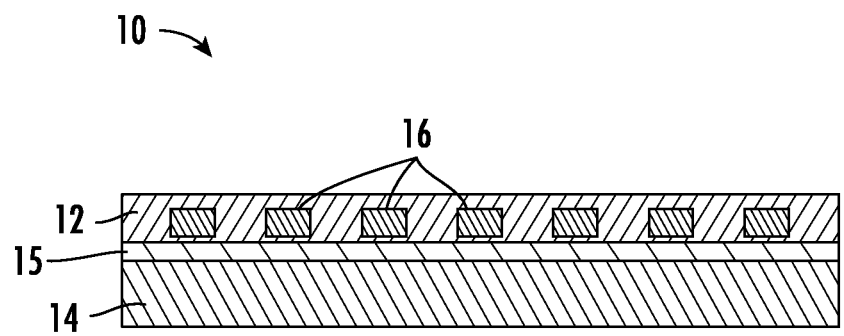
FIG. 1C is a cross sectional side view illustrating the deflectable platen of FIG. 1A having been elastically returned to an undeflected state.

In various embodiments, the deflection stress on the platen 10 during heating may be less than the yield strength of the materials of the first and/or second layers 12, 14. Thus, when the heat trace 15 (or other heat source) is deactivated and the platen 10 is allowed to cool to room temperature, the platen 10 may return to its original, generally planar state as shown in FIG. 1C. Thus, by varying the amount of heat applied to the first and second layers 12, 14, the platen 10 may be controllably deflected to varying degrees (e.g., from 0 to 20 thou) to match or approach the contour of wafers having various degrees of deflection disposed thereon to provide effective electrostatic clamping therebetween.

Figure 2:
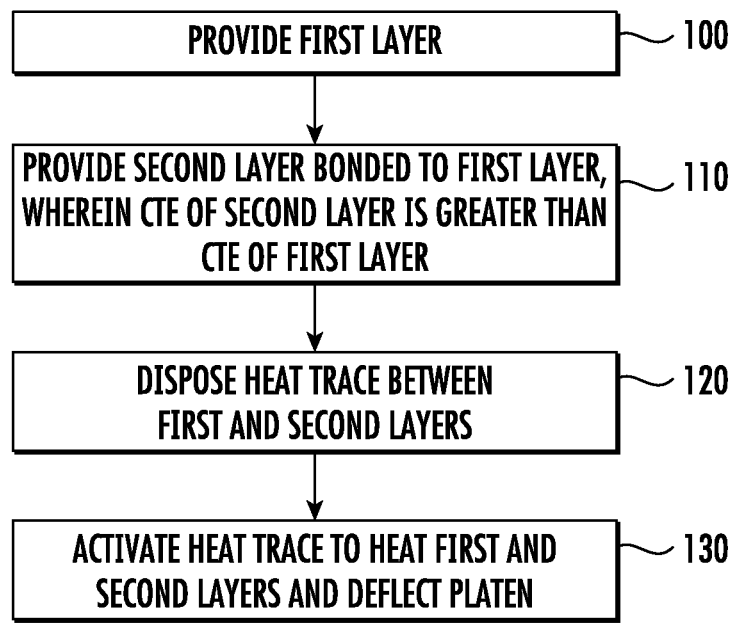
FIG. 2 is a flow diagram illustrating a method of deflecting a platen in accordance with an embodiment of the present disclosure.

Referring to FIG. 2, a flow diagram illustrating an exemplary method for deflecting a platen in accordance with the present disclosure is shown. The method will now be described in conjunction with the illustrations of the platen 10 shown in FIGS. 1A-1C.

At block 100 of the exemplary method, the first layer 12 may be provided and may be formed of a material having a first CTE. At block 110 of the method, the second layer 14 may be provided and may be formed of a material having a second CTE, and the second layer 14 may be flatly bonded to the first layer 12, such as by brazing or other appropriate techniques as described above. The second CTE may be greater than the first CTE. In various examples, the first layer 12 may be formed of a material having a CTE less than $6.0 \times 10^{-7}/°$ C. (e.g., between $2.0 \times 10^{-7}/°$ C. and $4.0 \times 10^{-7}/°$ C.) and the second layer 14 may have a CTE in a range between $6.0 \times 10^{-7}/°$ C. and $8.0 \times 10^{-7}/°$ C. The second layer 14 may have the plurality of electrodes 16 embedded therein. The electrodes 16 may be connected to a source of electrical power and may be arranged and configured to operate in the manner of a conventional electrostatic clamp familiar to those of skill in the art.

At block 120 of the exemplary method, the heat trace 15 may be disposed (e.g., sandwiched) between the first layer 12 and the second layer 14. This may be performed before or during bonding of the second layer 14 to the first layer 12. The heat trace 15 may include an electrical heating element (e.g., one or more wires, cables, plates, tapes, etc.) connected to an electrical power source.

At block 130 of the exemplary method, the heat trace 15 may be activated, thus heating the first and second layers 12, 14. Since the CTE of the second layer 14 is greater than the CTE of the first layer 12, the heated second layer 14 may expand more (i.e., more quickly and/or to a greater degree) than the heated first layer 12, resulting in a convex deflection of the platen 10. Thus, as shown in FIG. 1B, the contour of the top surface of the platen 10 may be made to more closely match the contour of the bottom surface of the wafer 18 to reduce the size of the gap 20 therebetween relative to the undeflected state of the platen 10 shown in FIG. 1A.

Figure 3A:
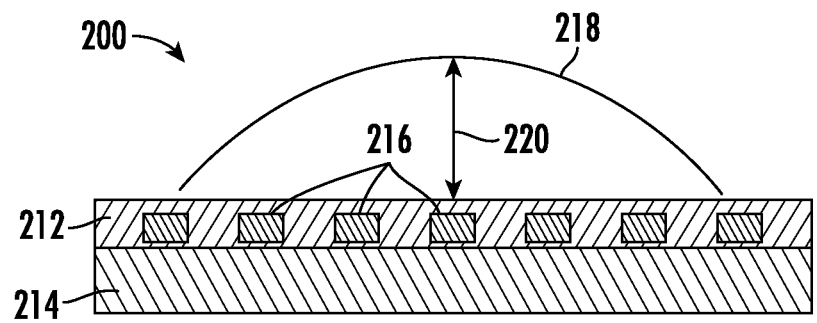
FIG. 3A is a cross sectional side view illustrating another exemplary embodiment of a deflectable platen in accordance with the present disclosure with a semiconductor wafer disposed thereon.

Referring to FIG. 3A, a cross-sectional side view illustrating a deflectable platen 200 (hereinafter "the platen 200") in accordance with another exemplary embodiment of the present disclosure is shown. The platen 200 may be plastically deformable (as further described below) for providing a close clearance relationship between a top surface of the platen 200 and a bottom surface of a warped or bowed semiconductor wafer disposed upon the platen 200 to facilitate effective electrostatic clamping therebetween.

The platen 200 may include a generally planar first layer 212 formed of a first material and a generally planar second layer 214 formed of a second material disposed atop the first layer 212. The first material may have a first coefficient of thermal expansion (CTE) and the second material may have a second CTE, wherein the first CTE may be greater than the second CTE. The first and second layers 212, 214 may be flatly bonded together, such as by epoxy or other techniques suited to bonding the first and second materials together.

In one example, the first layer 212 of the platen 200 may be formed of a material having a CTE greater than $20.0 \times 10^{-7}/°$ C. (e.g., a material having a CTE of approximately $24.0 \times 10^{-7}/°$ C.). In a specific example, first layer 212 may be formed of porous aluminum alloy. The present disclosure is not limited in this regard. The first layer 212 may alternatively be formed of other relatively high-CTE materials, including, and not limited to, aluminum, silver, copper, and their alloys. In one example, the second layer 214 of the platen 200 may be formed of a material having a relatively lower CTE than the first layer 112 (e.g., a material having a CTE in a range between $6.0 \times 10^{-7}/°$ C. and $8.0 \times 10^{-7}/°$ C.). In a specific example, second layer 214 may be formed of a ceramic, including, and not limited to, aluminum oxide. The present disclosure is not limited in this regard. The second layer 214 may alternatively be formed of other relatively lower-CTE materials including, and not limited to, carbon, silicon, silicon nitride, silicon carbide, aluminum nitride, INVAR, KOVAR, molybdenum, tungsten, tantalum, titanium, and their alloys.

The second layer 214 of the platen 200 may have a plurality of electrodes 216 embedded therein. The electrodes 216 may be connected to a source of electrical power (not shown) and may be arranged and configured to operate in the manner of a conventional electrostatic clamp familiar to those of skill in the art. Particularly, by applying an electrical voltage across the electrodes 216, an electrical field can be generated and may hold a semiconductor wafer 218 (hereinafter "the wafer 218") to the platen 200 via electrostatic force. The strength of the electrostatic force acting on the wafer 218 will depend partly on the proximity of the wafer 218 to the electrodes 216. Ideally, the contour of the bottom surface of the wafer 218 will match or nearly match the contour of the top surface of the platen 200 (e.g., if both surfaces are planar), thus establishing a shortest possible distance between the electrodes 216 and the wafer 218 to provide strong electrostatic coupling therebetween. In some cases, a wafer, such as the wafer 218 shown in FIG. 3A, may be warped or bowed (e.g., deflected up to, and possibly greater than, 20 thou) and may present a concave bottom surface to the generally planar top surface of the platen 200 (the deflection of the wafer 218 as shown in FIG. 3A is exaggerated for purposes of illustration). The resulting gap 220 between the wafer 218 and the platen 200 may attenuate the electrostatic force acting on the wafer 218, thus resulting in poor electrostatic clamping between the platen 200 and the wafer 218.

Figure 3B:
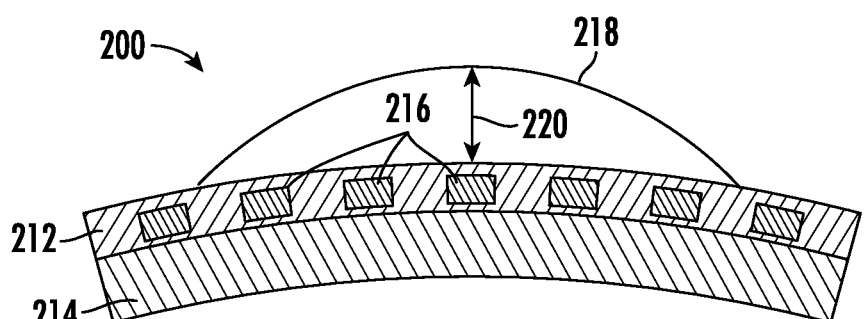
FIG. 3B is a cross sectional side view illustrating the deflectable platen of FIG. 3A in a deflected state with the semiconductor wafer disposed thereon.

Referring to FIG. 3B, the platen 200 is shown in a deflected state. Particularly, the platen has been rapidly and drastically cooled. In a non-limiting example, the platen 200 may be immersed in liquid nitrogen. The present disclosure is not limited in this regard. Since the CTE of the first layer 212 is greater than the CTE of the second layer 214, the cooled first layer 212 may contract more (i.e., more quickly and/or to a greater degree) than the cooled second layer 214, resulting in a convex deflection of the platen 200. Thus, the contour of the top surface of the platen 200 may be made to more closely match the contour of the bottom surface of the wafer 218 to reduce the size of the gap 220 therebetween relative to the undeflected state of the platen 200 shown in FIG. 3A. In various examples, the platen 200 may be cooled to a temperature between −50 degrees Celsius and −150 degrees Celsius. In a particular non-limiting example, the platen 200 may exhibit a deflection of 22 thou when cooled to a temperature of −100 degrees Celsius. The present disclosure is not limited in this regard. The smaller gap 220 and closer proximity of the electrodes 216 to the wafer 218 facilitated by the deflected platen 200 provide a stronger electrostatic force acting on the wafer 218 relative to the electrostatic force applied by the undeflected platen 200 shown in FIG. 3A, thus resulting in better electrostatic coupling between the platen 200 and the wafer 218.

The degree of deflection in the heated platen 200 will depend on a number of factors, including, and not limited to, the CTEs of the first and second layers 212, 214, the amount of cooling applied to the first and second layers 212, 214, the diameters of the first and second layers 212, 214, and the thicknesses of the first and second layers 212, 214. In a non-limiting embodiment, the thickness of the first layer 212 may be 4 millimeters and the thickness of the second layer 214 may be 4 millimeters. In another non-limiting embodiment, the thickness of the first layer 212 may be 6 millimeters and the thickness of the second layer 214 may be 4 millimeters. In another non-limiting embodiment, the thickness of the first layer 212 may be 8 millimeters and the thickness of the second layer 214 may be 4 millimeters. The present disclosure is not limited in this regard, and the thicknesses of the first and second layers 212, 214 may be varied from those mentioned above.

Figure 3C:
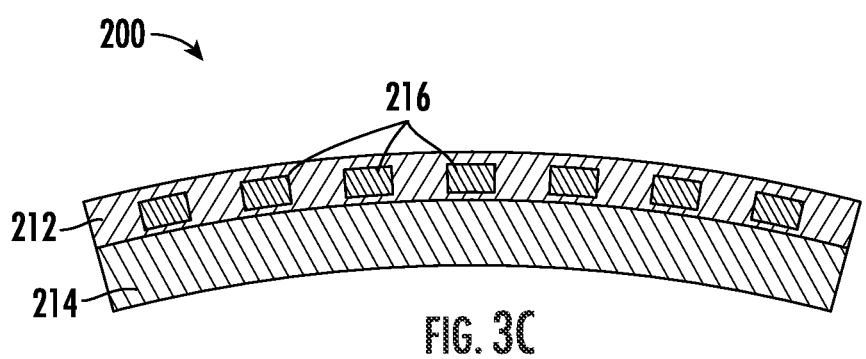
FIG. 3C is a cross sectional side view illustrating the deflectable platen of FIG. 3A plastically maintained in a deflected state.

In various embodiments, the deflection stress on the platen 200 during cooling may be greater than the yield strength of the material of the first layer 212 and/or the yield strength of the material of the second layer 214. Thus, when the platen 200 is allowed to warm to room temperature, the platen 200 may remain in its convex, deflected state as shown in FIG. 3C (i.e., plastic deformation). If, during cooling, the platen 200 was deflected beyond a desired, target amount of deflection (i.e., made more convex than desired), the platen 200 may be heated, such as by an external heat source (e.g., an oven). Since the CTE of the first layer 212 is greater than the CTE of the second layer 214, the heated first layer 212 may expand more (i.e., more quickly and/or to a greater degree) than the heated second layer 214, resulting in a reverse deflection of the platen 200 (i.e., relative to when the platen 200 was cooled), thus reducing the convexity of the platen 200. The deflection stress on the platen 200 during heating may be greater than the yield strength of the material of the first layer 212 and/or greater than the yield strength of the material of the second layer 214, thus resulting in plastic deformation. The above-described cooling and heating of the platen 200 may be repeated as necessary until a desired amount of deflection in the platen 200 is achieved. Thus, by varying the amount of cooling and heating applied to the first and second layers 212, 214, the platen 200 may be controllably deflected to varying degrees (e.g., from 0 to 22 thou) to match or approach the contour of wafers having various degrees of deflection disposed thereon to provide effective electrostatic clamping therebetween.

Figure 4:
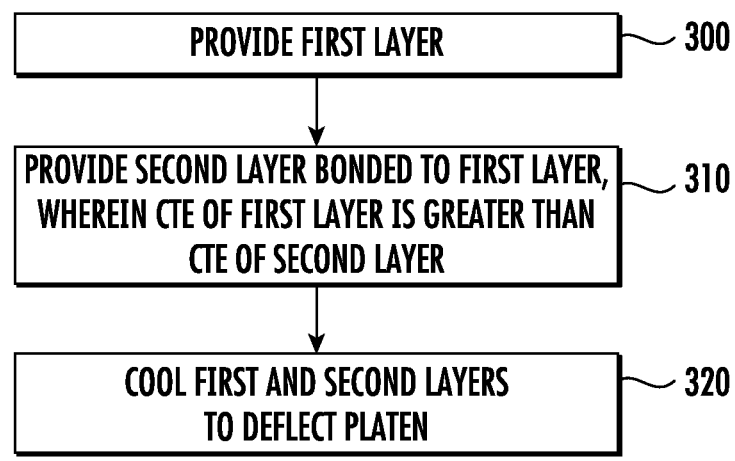
FIG. 4 is a flow diagram illustrating another method of deflecting a platen in accordance with an embodiment of the present disclosure.

Referring to FIG. 4, a flow diagram illustrating an exemplary method for deflecting a platen in accordance with the present disclosure is shown. The method will now be described in conjunction with the illustrations of the platen 200 shown in FIGS. 3A-3C.

At block 300 of the exemplary method, the first layer 212 may be provided and may be formed of a material having a first CTE. At block 310 of the method, the second layer 214 may be provided and may be formed of a material having a second CTE, and the second layer 214 may be flatly bonded to the first layer 212, such as by epoxy or other appropriate techniques as described above. The first CTE may be greater than the second CTE. In various examples, the first layer 212 may be formed of a material having a CTE in a range between $6.0 \times 10^{-7}/°C$ and $8.0 \times 10^{-7}/°C$ and the second layer 214 may have a CTE less than $6.0 \times 10^{-7}/°C$ (e.g., between $2.0 \times 10^{-7}/°C$ and $4.0 \times 10^{-7}/°C$). The second layer 214 may have the plurality of electrodes 216 embedded therein. The electrodes 216 may be connected to a source of electrical power and may be arranged and configured to operate in the manner of a conventional electrostatic clamp familiar to those of skill in the art.

At block 320 of the exemplary method, the platen 200 may be rapidly and drastically cooled. In a non-limiting example, the platen 200 may be immersed in liquid nitrogen. The present disclosure is not limited in this regard. Since the CTE of the first layer 212 is greater than the CTE of the second layer 214, the cooled first layer 212 may contract more (i.e., more quickly and/or to a greater degree) than the cooled second layer 214, resulting in a convex deflection of the platen 200. Thus, the contour of the top surface of the platen 200 may be made to more closely match the contour of the bottom surface of the wafer 218 to reduce the size of the gap 220 therebetween relative to the undeflected state of the platen 200 shown in FIG. 3A.

As will be appreciated by those of ordinary skill in the art, the above-described deflectable platens 10, 200 and related methods provide distinct advantages relative to conventional platens. For example, in the case of the elastically deformable platen 10 described above, the platen 10 can be dynamically deflected through the selective application of heat (e.g. via heat trace 15) to rapidly and conveniently facilitate effective electrostatic clamping with wafers having various degrees of deflection. In the case of the plastically deformable platen 200 described above, the platen 200 can be deformed once (via the application of cooling and heating) to achieve a desired degree of deflection and will thereafter retain its deflected shape to facilitate effective electrostatic clamping with similarly deflected wafers in the absence of any further cooling or heating.

The present disclosure is, not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of deflecting a platen comprising:
   providing a first layer formed of a material having a first coefficient of thermal expansion (CTE);
   providing a second layer formed of a material having a second CTE bonded to, and in directed contact with, the first layer, the second layer including a plurality of electrodes embedded therein for facilitating electrostatic clamping of wafers to the second layer, wherein the second CTE is different than the first CTE; and
   activating a heat trace disposed between the first layer and the second layer to heat the first layer and the second layer to a temperature in a range of 200 degrees Celsius to 600 degrees Celsius, wherein the heat trace is disposed entirely between, and is in direct contact with, the first layer and the second layer.

2. The method of claim 1, wherein the second CTE is greater than the first CTE.

3. The method of claim 2, wherein the first CTE is between $2.0 \times 10^{-7}/°C$ and $4.0 \times 10^{-7}/°C$, and the second CTE is between $6.0 \times 10^{-7}/°C$ and $8.0 \times 10^{-7}/°C$.

4. The method of claim 2, wherein the first layer is formed of at least one of quartz, carbon, silicon, silicon nitride, silicon carbide, aluminum nitride, INVAR, KOVAR, molybdenum, tungsten, tantalum, and titanium.

5. The method of claim 2, wherein the second layer is formed of at least one of ceramic, aluminum, silver, and copper.

6. The method of claim 1, wherein the heat trace comprises at least one of a wire, a cable, a plate, and a tape connected to a source of electrical power.

7. The method of claim 1, wherein the first CTE is greater than the second CTE.

8. The method of claim 7, wherein the second CTE is between $2.0 \times 10^{-7}/°C$ and $4.0 \times 10^{-7}/°C$, and the first CTE is between $6.0 \times 10^{-7}/°C$ and $8.0 \times 10^{-7}/°C$.

* * * * *